US010241159B2

(12) United States Patent
Vervaeke et al.

(10) Patent No.: US 10,241,159 B2
(45) Date of Patent: Mar. 26, 2019

(54) DEVICES AND METHODS FOR DETERMINING A MAGNETIC FIELD (71) Applicant: MagCam NV, Leuven (BE)

(72) Inventors: Koen Vervaeke, Linden (BE); Lieven Philips, Langdorp (BE)

(73) Assignee: MAGCAM NV, Leuven (BE)

( * ) Notice: Subject to any disclaimer, the term of this patent is extended or adjusted under 35 U.S.C. 154(b) by 3 days.

(21) Appl. No.: 15/037,001

(22) PCT Filed: Apr. 2, 2015

(86) PCT No.: PCT/EP2015/057299
§ 371 (c)(1),
(2) Date: May 16, 2016

(87) PCT Pub. No.: WO2015/155111
PCT Pub. Date: Oct. 15, 2015

(65) Prior Publication Data
US 2017/0123019 A1 May 4, 2017

(30) Foreign Application Priority Data

Apr. 9, 2014 (EP) .................................... 14164069

(51) Int. Cl.
G06F 19/00 (2018.01)
G01R 33/10 (2006.01)
(52) U.S. Cl.
CPC ............. G01R 33/10 (2013.01); G06F 19/00 (2013.01)
(58) Field of Classification Search
CPC . A63F 13/21; A63F 13/235; B60K 2350/102; B60K 2350/1024

(Continued)

(56) References Cited

U.S. PATENT DOCUMENTS

| 2004/0189123 A1* | 9/2004 | Nusser ................ F16C 32/0406 310/90.5 |
| 2007/0046287 A1 | 3/2007 | Vervaeke et al. |
| 2012/0209546 A1 | 8/2012 | Vervaeke et al. |

OTHER PUBLICATIONS

Hwang, J., et al., "The application of differential-type Hall sensors array to the nondestructive testing of express train wheels," NDT&E International, 2009, vol. 42, pp. 34-41.

(Continued)

Primary Examiner — Edward Raymond
(74) Attorney, Agent, or Firm — Duane Morris LLP; J. Rodman Steele, Jr.; Gregory M. Lefkowitz (57) ABSTRACT A method for determining a magnetic vector field in a predetermined area, the method comprising:
  determining distribution data comprising values of a first of three components of a magnetic field along a first direction, for a predetermined area defined on a predetermined surface, the predetermined surface being defined by a second and a third direction, wherein the first, second and third directions constitute an orthogonal set of axes;
  determining distribution data comprising values of the second and the third component of the magnetic field in the second and the third direction respectively, for the predetermined area defined in the predetermined surface;
wherein determining distribution data comprising values of the second and the third component is based on making use of intrinsic physical relations between the first, second and third components of the magnetic field distribution; and associated device.

14 Claims, 8 Drawing Sheets (58) Field of Classification Search
USPC .................................... 702/65, 66, 182–185
See application file for complete search history.

(56) References Cited

OTHER PUBLICATIONS

Hwang, J., et al., "Modeling of a Scan Type Magnetic Camera Image Using the Improved Dipole Model," J. of Mech. Sci. & Tech., 2006, vol. 20, No. 10, pp. 1691-1701.

* cited by examiner

Fig. 1

| 21 | 20 | 21 |
|----|----|----|
| 20 | 1  | 20 |
| 21 | 20 | 21 |

DEVICES AND METHODS FOR DETERMINING A MAGNETIC FIELD

CROSS-REFERENCE TO RELATED APPLICATIONS

This application is a § 371 national stage entry of International Application No. PCT/EP2015/057299, filed Apr. 2, 2015, which claims priority to European Patent Application No. 14164069.8 filed Apr. 9, 2014, the entire contents of which are incorporated herein by reference.

TECHNICAL FIELD

The present disclosure relates to devices and methods for determining a magnetic field of a magnet.

BACKGROUND ART

Fast and accurate quality inspection of permanent magnets is increasingly important in development and production of many technological products, such as position sensors, electric motors and actuators, speakers and microphones, medical devices, automotive electronics etc. The quality of the end product is often directly influenced and largely dependent on the quality of permanent magnets in these products. Moreover, price volatility of rare earth materials, which are critical for making permanent magnets, force developers and manufacturers to use these precious materials in an efficient way, minimizing the amount of wasted magnet material, in other words, get the most performance out of the least amount of magnet material, meaning each magnet needs to conform to strict quality demands. Also from an economic point of view, quality control of permanent magnets is growing in importance.

A magnetic measurement system is known, also referred to as a magnetic field camera, which is an advanced magnet inspection technology for all kinds of permanent magnets, including uniaxial and multi pole magnets in various applications. The magnetic field camera technology is based on mapping the magnetic field distribution of a magnet using a plurality of magnetic field sensors.

In European patent application EP1720026, an example of such a magnetic field camera, also called a magnetic camera module, is described.

In European patent application EP2508906, an arrangement is described for characterizing magnetic systems based on an initialized set of input parameters of the magnetic system, the arrangement comprising:
means for measuring the magnetic field distribution, typically embodied as a magnetic camera module, and
means for determining an optimal expected magnetic field distribution of the magnetic system.

Existing magnetic camera devices are able to measure the out-of-plane component or z-component of a magnetic field, with respect to the plane defined by the camera's main surface.

In practice however, there exists an industrial need for improved devices and methods for measuring magnetic fields, which also provide information on the X and Y components of the magnetic field.

SUMMARY OF THE DISCLOSURE

It is an aim of the present disclosure to provide a method and associated devices for determining a magnetic vector field distribution in a predetermined area, for instance along a main surface of a magnet.

This aim is achieved according to the disclosure with the method and device showing the technical characteristics of the independent claims.

In a first aspect of the present invention, a method for determining a magnetic vector field in a predetermined two-dimensional area is disclosed, the method comprising:
determining distribution data comprising values of a first of three components of a magnetic field along a first direction, for a predetermined two-dimensional area defined on a predetermined surface, the predetermined surface being defined by a second and a third direction, wherein the first, second and third directions constitute an orthogonal set of axes, the distribution data preferably being determined on the points of a two-dimensional grid in the predetermined area, for instance by means of a magnetic field camera;
determining distribution data comprising values of the second and the third component of the magnetic field in the second and the third direction respectively, for the predetermined area defined in the predetermined surface, preferably on the points of the two-dimensional grid;
wherein determining a distribution of the second and the third component is based on making use of intrinsic physical relationships between first, second and third components of the magnetic field distribution.

It is an advantage of the above method that, while only measuring a first component of a magnetic vector field, the two other magnetic field components can also be determined without measuring the magnetic field at different positions along said first direction, or without having to change the relative positions of magnetic field (e.g. magnet) and magnetic field camera.

According to preferred embodiments, determining distribution data comprising values of a first of three components of a magnetic field along a first direction, for a predetermined two-dimensional area defined on a predetermined surface, comprises measuring the values of the first of three components of the magnetic field along the first direction in at least part of or all over the predetermined two-dimensional area, preferable by means of a magnetic field camera.

A magnetic field camera can for instance comprise an array or matrix of Hall sensors, or can be a magneto-optical system, or can comprise an array of other magnetic field sensors, such as magneto-resistive sensors, or it can comprise a single magnetic field sensor which is scanned in space.

Preferably, the predetermined area has a surface which is smaller than 1 $m^2$. More preferably, said predetermined area has a surface which is smaller than 100 $cm^2$.

Preferably, the two-dimensional grid on which the distribution data is determined has a spacing between its points of less than 2 mm (or 2°) in both the second and third directions. More preferably said spacing is less than 0.2 mm (or 0.2°) in said directions, the unit of 'mm' or '°' being determined by the unit of the corresponding axis in the used coordinate system.

The first, second and third directions can for instance constitute an orthogonal axis system with Cartesian coordinates (X, Y, Z). In such a reference system, a magnetic vector field is represented by a set of orthogonal components ($B_x$, $B_y$, $B_z$). The first component can for instance correspond to the Z-component of a magnetic field $B_z$, which is the out of plane component of a vector field with respect to a plane defined by the X and Y axes of the coordinate system. The X and Y axes of the coordinate system define a plane which can correspond to a measurement surface, for instance an upper surface of a magnetic field sensor of a magnetic field camera.

Alternatively, the first, second and third directions can for instance constitute an orthogonal axis system with cylindrical coordinates (R, θ, Z). In such a reference system, a magnetic vector field is field is represented by a set of orthogonal components ($B_r$, $B_θ$, $B_z$). The first component can for instance correspond to the R-component of a magnetic field $B_r$, which is the radial component of a vector field with respect to a cylinder axis defined by the Z axis of the coordinate system. The θ and Z axes of the coordinate system define, for a certain R-value, a cylinder surface which can correspond to the measurement surface of a one-dimensional array of magnetic field sensors, which measure the radial component of the magnetic field (i.e. the component along said R-axis), and which is scanned while the cylinder is rotating.

Alternatively, the first, second and third directions can for instance constitute an orthogonal axis system with spherical coordinates (R, θ, φ). In such a reference system, a magnetic vector field is represented by a set of orthogonal components ($B_r$, $B_θ$, $B_φ$). The first component can for instance correspond to the R-component of a magnetic field $B_r$, which is the radial component of a vector field with respect to a point defined by the center of the spherical coordinate system. The θ and φ axes of the coordinate system define a spherical surface which can correspond to the measurement surface of a bent one-dimensional array of magnetic field sensors, which measure the radial component of the magnetic field (i.e. the component along said R-axis). The sensors can thereby for instance be arranged on a half circle which is then rotated around said center point, thereby describing a spherical surface, on which a grid of measurement points results.

According to preferred embodiments, the magnetic vector field is a field which needs to be characterized by a magnetic camera device. For instance, the magnetic vector field can be the field generated by a permanent magnet, an assembly of permanent magnets, an electromagnet, or any other object which acts as a source of magnetic field, the qualities of which have to be measured. The magnetic camera device can be for instance a camera device based on a matrix of Hall-sensors, or a magnetic camera device of the magneto-optical type, or it can be based on a matrix of other magnetic field sensors such as magneto-resistive sensors or pickup coils. These embodiments are especially beneficial when the distribution data are to be characterized in a Cartesian coordinate system.

According to preferred embodiments, the magnetic vector field is a field which needs to be characterized by a one-dimensional array of magnetic field sensors, such as Hall sensors, magneto-resistive sensors, or pickup coils, that is mechanically scanned in one direction in order to obtain a two-dimensional distribution of the magnetic field. Thereby the scanning direction could be in a Cartesian direction (X, Y or Z) or in an axis in a cylindrical coordinate system (R, θ or Z), for example by relatively rotating the sensor array and the magnetic field source to be measured, or it can be in a spherical coordinate system. For instance, the magnetic vector field can be the field generated by a permanent magnet, an assembly of permanent magnets, an electromagnet, or any other object which acts as a source of magnetic field, the qualities of which have to be measured. These embodiments are especially beneficial when the distribution data need to be characterized in a Cartesian or cylindrical coordinate system.

According to preferred embodiments, the magnetic vector field is a field which needs to be characterized by one single magnetic field sensor, such as a Hall sensor, a magneto-resistive sensor, or a pickup coil, that is mechanically scanned in two directions in order to obtain a two-dimensional distribution of the magnetic field. Thereby the scanning direction could be in a Cartesian direction (X, Y or Z) or in an axis in a cylindrical coordinate system (R, θ or Z), for example by relatively rotating the sensor and the magnetic field source to be measured, or it can be in a spherical coordinate system. For instance, the magnetic vector field can be the field generated by a permanent magnet, an assembly of permanent magnets, an electromagnet, or any other object which acts as a source of magnetic field, the qualities of which have to be measured. These embodiments are especially beneficial when the distribution data need to be characterized in a Cartesian or cylindrical coordinate system.

According to preferred embodiments, the method further comprises:
generating additional distribution data of the first component, the additional distribution data comprising expected values for the first component of the magnetic field in an extension area, the extension area adjacent to the predetermined area, for instance surrounding said predetermined area; and
determining distribution data comprising values of the second and the third component of said magnetic field in the second and the third direction respectively, for an extended set of distribution data, the extended set of distribution data comprising the distribution data and the additional distribution data.

The predetermined area can for instance correspond to a sensitive area of a magnetic camera device, for instance the total sensitive area.

It is an additional advantage of this type of embodiments, that the second and third components of the magnetic vector field can be determined much more precisely than if no additional distribution data would be generated. Indeed, by generating the additional distribution data and applying for instance a Fourier transform to the extended set of distribution data, the results of the Fourier transform operation, manipulations based on implicit physical relationships between first, second and third components of the field distribution and an inverse Fourier transform, and thus the determination of the second and third components of the magnetic vector field, correspond better to the real values of the second and third components.

According to preferred embodiments, determining distribution data comprising values of a first component of a magnetic field along a first direction, for a predetermined area defined in a predetermined surface, comprises measuring measurement values of the first component by means of a magnetic camera.

According to preferred embodiments, determining distribution data comprising values of a first component of a magnetic field along a first direction, for a predetermined area defined in a predetermined surface, comprises measuring measurement values of the first component by means of a one-dimensional array of magnetic field sensors the position of which is mechanically driven in order to scan said predetermined area.

According to preferred embodiments determining distribution data comprising values of a first component of a magnetic field along a first direction, for a predetermined area defined in a predetermined surface, comprises measuring measurement values of the first component by means of one magnetic field sensor the position of which is mechanically driven in order to scan said predetermined area.

According to preferred embodiments, determining distribution data comprising values of a first component of a magnetic field along a first direction, for a predetermined area defined in a predetermined surface, further comprises modeling the measurement values of the first component based on a predetermined model and/or predetermined input parameters. This can for instance be performed with methods and devices disclosed in EP2508906.

According to preferred embodiments, the distribution data of the first component comprises non-zero values for the first component of the magnetic field corresponding to a location at an outer border of the predetermined area.

According to preferred embodiments, the method comprises determining the values of the first component comprised in the additional distribution data by simulation of the first component in the predetermined area and extrapolating the simulation into the extension area.

According to preferred embodiments, the values of the first component comprised in the additional distribution data are set to zero.

According to preferred embodiments, the values of the first component comprised in the additional distribution data are set to be monotonously decreasing to zero in the extension area when moving from an outer boundary of the predetermined area, away from the predetermined area, towards an outer border of the extension area.

According to preferred embodiments, the method comprises determining the values of the first component comprised in the additional distribution data by:
  extrapolating or setting values of the first distribution data of the first component corresponding to the outer boundary of the predetermined area onto the extension area;
  applying a window function on the extrapolated values for the extension area, said window function evolving from value 1 to value 0 over the extension area when moving away from the predetermined area.

According to preferred embodiments, the method comprises determining the values of the first component comprised in the additional distribution data by generating values of the first component which are exponentially decreasing over the extension area when moving away from the predetermined area, starting from the outer boundary of the predetermined area, such that the values of the first component are attenuated towards zero, i.e. close to zero or zero, at the outer boundary of the extension area.

Optionally, additionally, a window function can be applied on the exponentially decreasing values for the extension area, the window function evolving from value 1 to value 0 over the extension area when moving away from the predetermined area.

According to preferred embodiments, the method comprises determining the values of the first component comprised in the additional distribution data by:
  generating a spline, polynomial or rational representation of the values of the first component of the magnetic field for at least part, at least an outer or peripheral part, or all of the predetermined area;
  extrapolating the spline, polynomial or rational representation to extrapolated values of the first component of the magnetic field in the extension area;
  optionally, applying a window function on the extrapolated values for the extension area, the window function evolving from value 1 to value 0 over the extension area when moving away from the predetermined area.

A spline representation is known to the skilled person. A spline is a sufficiently smooth polynomial function that is piecewise-defined, and possesses a high degree of smoothness at the places where the polynomial pieces connect. Also the concepts of a polynomial representation and a rational representation are supposed to be known to the skilled person.

According to preferred embodiments, determining distribution data of the second and third components comprises performing a Fourier transformation, followed by performing manipulations or calculations based on intrinsic physical relationships between the magnetic field components, followed by an inverse Fourier transformation.

A Fourier transformation is known to the skilled person. The Fourier Transform is a mathematical transformation which is commonly used in image processing and is used to decompose an image (or a two-dimensional array of data points) into its sine and cosine components. The output of the transformation represents the image in the Fourier or frequency domain, while the input image is the spatial domain equivalent. In the Fourier domain image, each point represents a particular frequency contained in the spatial domain image. The frequency is here to be understood in terms of spatial frequency, also called 'k-space', which term is commonly used to describe spatial frequencies, also called 'wave numbers'. However, the mathematical operations used in Fourier Transforms make abstraction of the units and coordinate system that are used, and are equally useable for time domain signals (which are usually one-dimensional), as well as spatial domain signals, be they one-dimensional, two-dimensional or even 'n-dimensional' (where 'n' is any strictly positive integer number).

For the case where 'n'=2, being the two-dimensional case, the spatial domain can furthermore be specified in any coordinate system, such as a Cartesian, cylindrical or spherical coordinate system. In every such case, the distribution data can be formalized in a two-dimensional matrix to which the Fourier transform can be applied.

The determination of the second and third magnetic field components is based on implicit physical relationships between first, second and third components of the magnetic field distribution, exploited for instance by manipulation of data in the Fourier transformed domain, and then performing an inverse Fourier transformation.

According to preferred embodiments, performing manipulations or calculations comprises multiplying the Fourier transform of the first component with a factor which is at least a function of spatial frequencies corresponding to the second and/or third directions. Preferably, this factor is, or is also, a function of the magnitude of the spatial frequency vector determined by the second and third directions.

According to preferred embodiments, the function is a complex function.

According to preferred embodiments, the function only has an imaginary part.

According to preferred embodiments, the factor is or comprises a function of the ratio of the spatial frequency corresponding to the second or the third direction, over the magnitude of the spatial frequency vector determined by the second and third directions.

According to preferred embodiments, the Fourier transformation, the calculations based on intrinsic physical relationships between the magnetic field components and the inverse Fourier transformation are performed block-wise, thereby using 'overlap-add' or 'overlap-save' methods.

In a second aspect of the present invention, a device for determining a magnetic vector field in a predetermined two-dimensional area is disclosed, the device comprising:

a means for determining a distribution of a first of three components of a magnetic field along a first direction, for a predetermined area defined on a predetermined surface, the predetermined surface being defined by a second and a third direction, wherein the first, second and third directions constitute an orthogonal set of axes;

a means for determining a distribution of the second and the third components of the magnetic field in the second and the third directions respectively, for the predetermined area defined on the predetermined surface;

wherein the means for determining distribution data comprising values of the second and the third component is adapted for manipulating distribution data of the first component based on intrinsic physical relations between the first, second and third components of the magnetic vector field.

According to preferred embodiments, the means for determining distribution data of the second and third components is adapted for performing at least a Fourier transform and an inverse Fourier transform.

According to preferred embodiments, the means for determining a distribution of a first component in the predetermined area comprises a magnetic camera device comprising a sensing area, the sensing area corresponding to the predetermined area.

According to preferred embodiments, the means for determining a distribution of a first component in the predetermined area comprises a one-dimensional array of magnetic field sensors which the position of which is mechanically driven in order to scan the predetermined area, and records the first component of the distribution in the predetermined area.

According to preferred embodiments, the means for determining a distribution of a first component in the predetermined area comprises a single magnetic field sensor the position of which is mechanically driven in order to scan the predetermined area and records the first component of the distribution in the predetermined area.

According to preferred embodiments, the device further comprises a means for generating additional distribution data of the first component, the additional distribution data comprising expected values for the first component of the magnetic field in an extension area, the extension area adjacent to the predetermined area; and a means for performing a Fourier transformation on an extended set of distribution data, the extended set of distribution data comprising the distribution data and the additional distribution data.

According to preferred embodiments, the means for generating additional distribution data of the first component comprises a means for simulating the first component in the predetermined area and extrapolating the simulation into the extension area.

In a third aspect of the present invention, a computer program or software product is disclosed, which is adapted for performing any of the methods according to the first aspect of the present invention, when run on a computer.

Features and advantages disclosed for one of the above aspects of the present invention are hereby also implicitly disclosed for the other aspects, mutatis mutandis, as the skilled person will recognize. For instance, the device may comprise any means necessary which are adapted to perform any of the embodiments described for the method aspect of the present invention.

According to preferred embodiments, all or part of the above is applied for the inspection of permanent magnets or magnet assemblies in industrial or academic applications, such as for sensor systems, switches and relays, electric motors, actuators, speakers, microphones, magnetic couplings, holding magnets, beam guiding systems, wigglers, undulators, permanent magnet bearings, measuring instruments, research equipment, new magnetic materials, non-destructive testing of magnetic materials such as steel.

Examples of industries where the present invention can be applied are: automotive, industrial, medical, consumer electronics, magnet production, research laboratories.

BRIEF DESCRIPTION OF THE DRAWINGS

The disclosure will be further elucidated by means of the following description and the appended figures.

FIGS. 1 to 8 illustrate embodiments of the present invention.

DETAILED DESCRIPTION OF PREFERRED EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

A method is described for determining a magnetic vector field in a predetermined area, which allows a determination of the three components of the magnetic vector field, by means of a magnetic camera device. The method comprises the steps of:

determining distribution data comprising values of a first of three components of a magnetic field along a first direction, for an predetermined area defined in a predetermined surface, the predetermined surface being defined by a second and a third direction, wherein the first, second and third directions constitute an orthogonal set of axes;

determining distribution data comprising values of the second and the third components of the magnetic field in the second and the third directions respectively, for the predetermined area defined in the predetermined surface;

wherein determining distribution data comprising values of the second and the third component is based on making use of intrinsic physical relations between the first, second and third components of the magnetic field distribution.

Determining a distribution of the second and the third components preferably includes performing a Fourier transformation on the distribution data of the first component, manipulating the Fourier transformed data and performing the inverse Fourier transform. Hereby physical relationships between first, second and third components of the field distribution are exploited.

One physical relationship between the first, second and third components of the magnetic field distribution is the simplified Ampere's circuital Law, which is valid for regions where there are no magnetic field sources and no varying electrical fields:

$$\nabla \times \vec{B} = \vec{0} \quad \text{Equation 1}$$

where $\vec{B}$ is the magnetic field vector. Expressing Equation 1 in Cartesian coordinates yields:

$$\frac{\partial B_z}{\partial y} - \frac{\partial B_y}{\partial z} = 0;$$

$$\frac{\partial B_z}{\partial x} - \frac{\partial B_x}{\partial z} = 0;$$

$$\frac{\partial B_x}{\partial y} - \frac{\partial B_y}{\partial x} = 0 \quad \text{Equation 2}$$

Where z is the direction out of the plane and x and y are the in-plane coordinates. Now we define the Fourier transforms $\hat{B}_x, \hat{B}_y, \hat{B}_z$ of the magnetic field components $B_x, B_y, B_z$ as follows:

$$\hat{B}_{x,y,z}(k_x, k_y, z) = \int_{-\infty}^{+\infty}\int_{-\infty}^{+\infty} B_{x,y,z}(x, y, z) e^{-i(k_x x + k_y y)} dx dy$$

$$B_{x,y,z}(x, y, z) = \frac{1}{4\pi^2}\int_{-\infty}^{+\infty}\int_{-\infty}^{+\infty} \hat{B}_{x,y,z}(k_x, k_y, z) e^{i(k_x x + k_y y)} dk_x dk_y \quad \text{Equation 3}$$

Where i is the imaginary unit, $k_x$ and $k_y$ denote the wave numbers or spatial frequencies in the xy-plane and $\hat{B}_x, \hat{B}_y, \hat{B}_z$ denote the Fourier transforms of $B_x, B_y, B_z$, respectively. The second formula in Equation 3 is the inverse Fourier transform.

When the Fourier transform of the expressions in Equation 2 is calculated, we obtain:

$$ik_y \cdot \hat{B}_z(k_x, k_y, z) - \frac{\partial \hat{B}_y(k_x, k_y, z)}{\partial z} = 0$$

$$ik_x \cdot \hat{B}_z(k_x, k_y, z) - \frac{\partial \hat{B}_x(k_x, k_y, z)}{\partial z} = 0$$

$$ik_y \cdot \hat{B}_x(k_x, k_y, z) - ik_x \cdot \hat{B}_y(k_x, k_y, z) = 0 \quad \text{Equation 4}$$

The first two formulas in Equation 4 contain partial derivatives of the in-plane magnetic field components in the spatial frequency domain with respect to the z-direction. These two expressions can be rewritten by making use of the definition of a partial derivative:

$$\lim_{\delta z \to 0} \frac{\hat{B}_y(k_x, k_y, z + \delta z) - \hat{B}_y(k_x, k_y, z)}{\delta z} = ik_y \cdot \hat{B}_z(k_x, k_y, z) \quad \text{Equation 5}$$

$$\lim_{\delta z \to 0} \frac{\hat{B}_x(k_x, k_y, z + \delta z) - \hat{B}_x(k_x, k_y, z)}{\delta z} = ik_x \cdot \hat{B}_z(k_x, k_y, z)$$

Equation 5 can be further rewritten by making use of Green's identities:

$$\lim_{\delta z \to 0} \frac{\hat{B}_y(k_x, k_y, z) e^{-\sqrt{k_x^2 + k_y^2}\,\delta z} - \hat{B}_y(k_x, k_y, z)}{\delta z} = \quad \text{Equation 6}$$

$$ik_y \cdot \hat{B}_z(k_x, k_y, z)$$

$$\lim_{\delta z \to 0} \frac{\hat{B}_x(k_x, k_y, z) e^{-\sqrt{k_x^2 + k_y^2}\,\delta z} - \hat{B}_x(k_x, k_y, z)}{\delta z} = ik_x \cdot \hat{B}_z(k_x, k_y, z)$$

The limits in Equation 6 can be evaluated using l'Hôpital's rule and result in the following expressions:

$$\hat{B}_y(k_x, k_y, z) = \frac{-ik_y}{\sqrt{k_x^2 + k_y^2}} \cdot \hat{B}_z(k_x, k_y, z) \quad \text{Equation 7}$$

$$\hat{B}_x(k_x, k_y, z) = \frac{-ik_x}{\sqrt{k_x^2 + k_y^2}} \cdot \hat{B}_z(k_x, k_y, z)$$

Equation 7 says that the $B_x$ and $B_y$ components of the magnetic field can be obtained from a two-dimensional distribution of the $B_z$ component of the magnetic field.

While the derivation of Equation 7 makes use of a Cartesian coordinate system, this result can also be applied in a cylindrical coordinate system, as is shown now. Consider a cylindrical coordinate system, determined by a Z-axis, with the following orthogonal directions: the radial direction 'r' is perpendicular to the Z-axis, the angular direction 'θ' is perpendicular to both the Z-axis and the radial direction and indicates the rotational direction around the Z-axis, the third coordinate is the Z-direction.

First it is shown how the θ and Z-components $B_\theta$ and $B_z$ of a magnetic field distribution can be obtained from the distribution of the radial component $B_r$ on the curved surface of a cylinder with radius 'R' and height 'H' in the Z-direction. The curved cylinder surface can be transformed into a flat surface by 'developing' the cylinder. This cylinder surface in the cylindrical coordinate system (R,θ,Z) is then projected onto a Cartesian coordinate system (X',Y',Z') in the following way:

$$X' = R \cdot \theta \quad \text{Equation 8}$$

$$Y' = Z$$

$$Z' = R \quad \text{Equation 8}$$

And the magnetic field components in the cylindrical coordinate system are transformed in the Cartesian components in the following way:

$$B_{x'} = B_\theta$$

$$B_{y'} = B_Z$$

$$B_{z'} = B_R \quad \text{Equation 9}$$

The magnetic field components in the cylindrical coordinate system can now be treated as components in a Cartesian coordinate system and Equation 7 can be applied in order to determine the $B_\theta$ and $B_z$ components. Thereby it is to be noted that the field distribution on the cylinder is periodic in the $\theta$ direction and thus is preferably subject to periodic boundary conditions in the Cartesian coordinate system when the Fourier transform is performed.

Now it is shown how the $\theta$- and R-components $B_\theta$ and $B_R$ of a magnetic field distribution can be obtained from the distribution of the axial (Z-) component on a disk surface of a cylinder with radius 'r'. The disk surface in the cylindrical coordinate system (R,$\theta$,Z) can be transformed into a surface in Cartesian coordinates by projecting it onto a Cartesian coordinate system (X', Y', Z') in the following way:

$$X' = R \cdot \cos \theta$$

$$Y' = R \cdot \sin \theta$$

$$Z' = Z \quad \text{Equation 10}$$

And the magnetic field components in the cylindrical coordinate system are transformed in the Cartesian components in the following way:

$$B_{X'} = B_R \cdot \cos \theta - B_\theta \cdot \sin \theta$$

$$B_{Y'} = B_R \cdot \sin \theta + B_\theta \cdot \cos \theta$$

$$B_{Z'} = B_Z \quad \text{Equation 11}$$

The magnetic field components in the cylindrical coordinate system can now be treated as components in a Cartesian coordinate system and Equation 7 can be applied in order to determine the $B_{X'}$ and $B_{Y'}$ components. Thereby it is noted that the grid in the cylindrical coordinate system may not transform to a regular grid in the Cartesian coordinate system when Equation 10 is applied. However, the transformed grid can be made regular again by interpolation methods which are well known to persons skilled in the art. From the found $B_{X'}$ and $B_{Y'}$ components the $B_\theta$ and $B_R$ components can be readily retrieved by performing the inverse transformation of Equation 11. Thereby, another interpolation step might be needed in order to obtain the $B_\theta$ and $B_R$ values at the original grid points in the cylindrical coordinate system.

In order to obtain suitable boundary conditions on the outer periphery of the transformed disk surface in Cartesian coordinates, it may be needed to apply extrapolation methods according to methods described in the present invention. The person skilled in the art will recognize that the above method equally applies to a ring surface, where only the area between an inner radius and an outer radius is considered. Thereby, the inner disk surface, on which no data points are present, may be extrapolated according to methods described in the present invention.

It will be clear to a person skilled in the art that similar approaches can be applied to other coordinate systems, such as the spherical coordinate system.

In three-dimensional space with Cartesian axis system (X, Y, Z), the spatial distribution of the components of a magnetic field is measured in a predetermined area, for instance a rectangular or square area, the predetermined area being flat and corresponding to the X-Y plane of the Cartesian axis system.

Measurement of the magnetic field distribution can be performed by means of a magnetic field camera, which is based on a two-dimensional matrix of Hall-sensors, each of the Hall-sensors measuring the magnetic field locally. Alternatively, measuring the magnetic field can be performed with magneto-optical devices. Today, magnetic camera devices are able to only measure an out-of-plane component of a magnetic field. According to embodiments of the present invention, a measured magnetic field distribution for the first component of the magnetic vector field, for instance the Z-component, can be used to determine X and Y components. Hereby, Fourier analysis can advantageously be used. A practical application area is the field of determining the magnetic field distribution of a magnetic object, as for instance a permanent magnet.

The method described below can be applied on a measured distribution of the Z-component of a magnetic vector field, or can be applied on an improved version thereof. Indeed, the measured distribution of the Z-component of the magnetic field may be optimized, for instance according to a method described in European patent application EP2508906, before the X and Y components are being determined as set out below.

It will moreover be appreciated that the method can be used to determine second and third component values of a magnetic vector field along any surface, for instance a flat or curved surface, the latter being for instance a cylindrical surface or a spherical surface, which may be virtual, for which the distribution of the first component is known. Indeed, the used distribution data comprising values for the first component of a magnetic field vector may correspond to measured values, to corrected measured values, or to purely simulated values based on theoretical models, depending for instance on the context and application.

An important condition for allowing a correct calculation of the X and Y components is that the magnetic field on the outer boundary of the measured area, the predetermined area, satisfies the correct boundary conditions. In practice this can mean that the field on the boundary is close to zero or zero (for instance below the noise level), or it could mean that there are periodic boundary conditions. If the boundary conditions are not satisfied, errors can be introduced in the calculated X and Y components. Considering the case where the magnetic field is supposed to fall off to zero at large enough distances from the magnetic source, in theory one can use a predetermined area, or measurement area, which is large enough, such that the measured first component of the magnetic field can be neglected with respect to the measurement noise at the outer boundary of the measurement area, such that these errors are not being introduced.

In practice though, increasing the measurement area is not always possible, as this would mean an increase of the active area of a magnetic camera device or the use of more complex magnetic camera device systems, which combine a plurality of parallel or serial magnetic field camera measurements taken by a single or a plurality of magnetic cameras. This means that in practice, magnetic camera devices have a limited measurement area, corresponding to the predetermined area, for which the first component of the magnetic vector field is being measured. In that case, the Z-component of the magnetic field may not be small enough or zero at its outer boundaries, which jeopardizes the possibility of determining the X and Y component within the predetermined area with a sufficient precision.

If one measures the Z-component of a magnetic vector field of a magnetic object, the measured magnetic field will evolve monotonously to zero when the distance with respect to the magnetic object is increasing. If one measures in a two-dimensional area, by means of for instance the magnetic camera device comprising an active or measurement area corresponding to the predetermined area, which includes for instance a magnetic object, one can expect that the magnetic field on the outer boundary of the predetermined area will be monotonously evolving to zero, but will not have reached such a near-to-zero or zero value at these boundaries.

Figure 1:
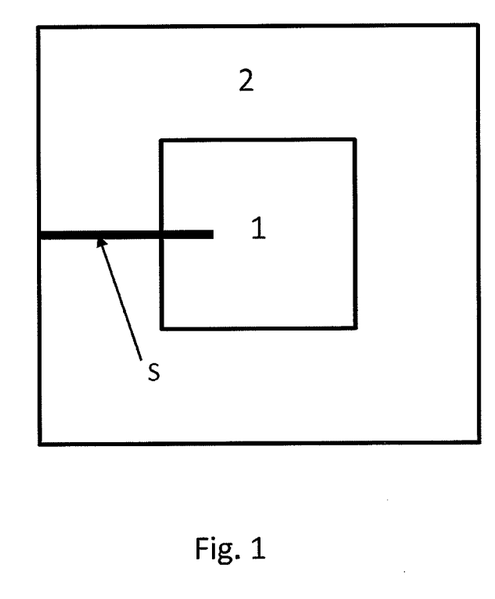

It's a further aim of the present invention to extrapolate the further evolution of the magnetic field components by virtually expanding the predetermined area (1), i.e. the active area of the magnetic field camera, in order to achieve a larger image. These areas are illustrated in FIG. 1. This larger image can be chosen such that the magnetic field on the outer boundaries thereof is indeed small enough, i.e. close to zero or zero. This larger image corresponds to the predetermined area (1) and an extension area (2), which is adjacent to, preferably directly adjacent to the predetermined area. Preferably the extension area (2) is surrounding the predetermined area (1). The extension area can for instance be the complement area of the predetermined area, of a rectangular or square area which surrounds the predetermined area, whereby the predetermined area can for instance be positioned in the center of this rectangular or square area. It is the aim of embodiments of the present invention to simulate the expected values of the first magnetic field component in the extension area in a way that does not substantially deviate from the way the field would evolve to zero in reality. The result is a distribution of the first component of the magnetic field in a virtual larger area that does not deviate substantially from an image that would be made if it were possible to measure in the extension area directly. The additional distribution data of the first component of the magnetic field corresponding to the expected values for the first component of the magnetic field in the extension area is then combined with the distribution data of the first component of the magnetic field in the predetermined area, together forming a extended set of distribution data, and a Fourier transformation is applied on this extended set.

Such a Fourier transformation, the manipulation of the Fourier transformed data, which exploits inherent physical relationships between first, second and third components of the field distribution, and performing the inverse Fourier transform, results in the X and Y components of the magnetic field. These distributions of the X and Y components are automatically generated for not only the predetermined area, but also the extension area. The X and Y distribution of the magnetic vector field in the extension area is often less important, and can be removed from the data set in order to end up with X, Y and Z components of the magnetic vector field in the predetermined area only.

In more general terms, the first, second and third directions do not necessarily correspond to the directions of a Cartesian coordinate system, but can equally apply to other coordinate systems, such as cylindrical or spherical coordinate systems. In the latter two cases, some directions have angular dimensions instead of length dimensions. For such directions, the extended area is usually not needed, as it suffices to obtain measurement data along the full circumference of such direction, e.g. along the full circumference of a cylinder. The measurement data in such dimensions are inherently periodical and have periodic boundary conditions, which means that the value at 360° is equal to that at 0°. Therefore in such case the Fourier transform will be calculated in a correct way without applying the extension area in such directions. Similar boundary conditions can be appropriate in certain cases in Cartesian coordinates, where for example a very long magnetic object with periodic magnetization profile is measured, and for which periodic boundary conditions are applied.

When the distribution of the measured magnetic field component on the boundaries of the predetermined area is not approaching zero, because for example the magnetic object is larger than the measurement area of the magnetic field camera, it can be needed to extend the predetermined measurement area in order to make sure that the measured distribution is sufficiently approaching zero at its boundaries, so that the methods of the present invention can be applied. For such case, it may be needed to measure a larger area by stepping the measurement area in the second and/or third directions, and at each new location measure the distribution in a new predetermined area which is adjacent to the previous predetermined area, after which all determined distributions are 'stitched' together as to result in one large predetermined area, on the borders of which the magnetic field has sufficiently evolved towards zero as to apply the extrapolation methods described in the present invention, with the aim to determine the second and third components of the magnetic field distribution. Methods and devices for accomplishing this are for example described in European patent application EP12188521.4 filed on 15 Oct. 2012 by the applicant of the present application, which are hereby incorporated by reference. Such a device can be described as a device for determining a magnetic field distribution of a magnet along a main surface of the magnet, the device comprising:

a. an arrangement of at least two independent magnetic field camera modules being arranged in a fixed relative position with respect to each other, each magnetic field camera module being adapted for measuring a magnetic field distribution to which it is exposed by means of a respective detection surface;

b. a means for providing a predetermined relative movement between the main surface and the arrangement to thereby scan the magnetic field distribution of the magnet along the main surface.

The associated method is a method for determining a magnetic field distribution of a magnet along a main surface of the magnet, the device comprising:

providing the magnet;

providing an arrangement of at least two independent magnetic field camera modules being arranged in a fixed relative position with respect to each other, each magnetic field camera module being adapted for measuring a magnetic field distribution to which it is exposed by means of a respective detection surface;

providing a predetermined relative movement between the main surface and the arrangement to thereby scan the magnetic field distribution of the magnet along the main surface.

In order to determine the second and third magnetic field components for this stitched distribution, the methods described in the present invention can be applied to the resulting (stitched) predetermined area.

Another method however is to apply the so-called 'overlap-add' and 'overlap-save' methods, which are known to persons skilled in the art of signal processing, whereby the Fourier transform, data manipulation based on intrinsic physical properties of a magnetic vector field, and inverse transform are performed on each individual predetermined area comprising the larger combined predetermined area, without applying the extrapolation methods described in the current invention. When combining the determined second and third components into the larger distribution, the overlap-save or overlap-add method is applied.

The overlap-add and overlap-save methods can also be applied in the other cases described in the present invention in the following way. Instead of first determining the additional distribution in the extended area, and after that applying data manipulation based on intrinsic physical properties of a magnetic vector field (for instance comprising applying a Fourier transform, manipulating the Fourier transformed data, and performing an inverse Fourier Transform) in order to obtain the other components of the distribution, The Fourier Transform, data manipulations, and Inverse Fourier Transform are applied separately to the predetermined area and to (sub-regions of) the extended area in a block-wise fashion. Thereby each of the blocks can be zero padded to a certain extent in order to create overlap regions between the back-transformed blocks. The resulting back-transformed blocks are then combined in the final larger matrix, whereby the overlap regions are added together. Additionally, the predetermined area can itself also be treated block-wise, for example in the case of a large magnet where the predetermined area is relatively large and is measured in a block-wise way. This method corresponds to the overlap-add method. A person skilled in the art will readily recognize the analogous possibility of applying the overlap-save method to the same data.

Alternatively, the predetermined and extended areas can be treated block-wise or section-wise, where the determination of the second and third components is performed on each block/section separately, and the results of them added together or saved according to overlap-add and overlap-save methods, respectively.

As a further improvement on the previous method, the overlap-add and overlap-save methods can also be used on an infinite extension area, where the extrapolation is expressed as an analytical function which the Fourier transform and other operations can be analytically determined on the interval stretching from infinity to the border of the predetermined area.

Distribution data of the first component of the magnetic vector field in the extension area can be determined in many ways, some of which are explained below.

FIGS. 3 to 8 illustrate examples of how additional distribution data for the first component of the magnetic vector field can be generated, according to embodiments of the present invention. The depicted patterns illustrate the evolution of the values of the first component along to a cross-section S as depicted in FIG. 1. The cross-section can comprise an outer portion of the predetermined area only, but can extend up until the centre of the predetermined area.

Figure 3:
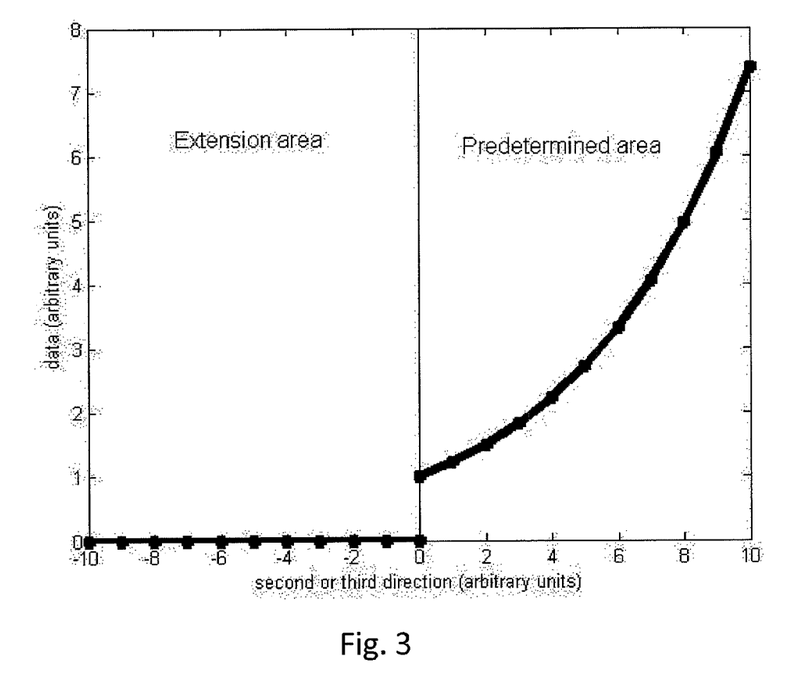
FIGS. 3 to 8 illustrate examples of how additional distribution data for the first component of the magnetic field vector can be generated, according to embodiments of the present invention.

According to a first embodiment, illustrated in FIG. 3, the Z-component or first component of the magnetic field vector is set to value zero (0) in the complete extension area. When the measured values of the component of the magnetic vector field on the outer boundary of the predetermined area differ from zero, the method may though introduce a discontinuity in the values on the outer boundary of the predetermined area, which may still introduce errors in a subsequent calculation of the X and Y components of the magnetic field vector.

Figure 8:
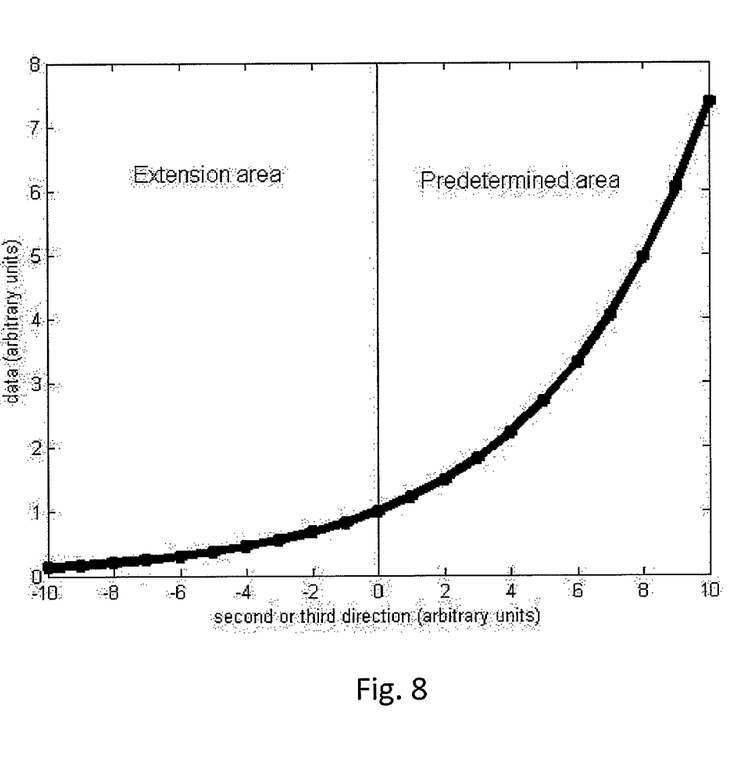

According to an alternative embodiment, illustrated in FIG. 8, of the present invention, the additional distribution data comprising the first component of the magnetic field vector is simulated or modeled for the predetermined area and the simulation results or model are/is extrapolated into the extension area.

Figure 2:
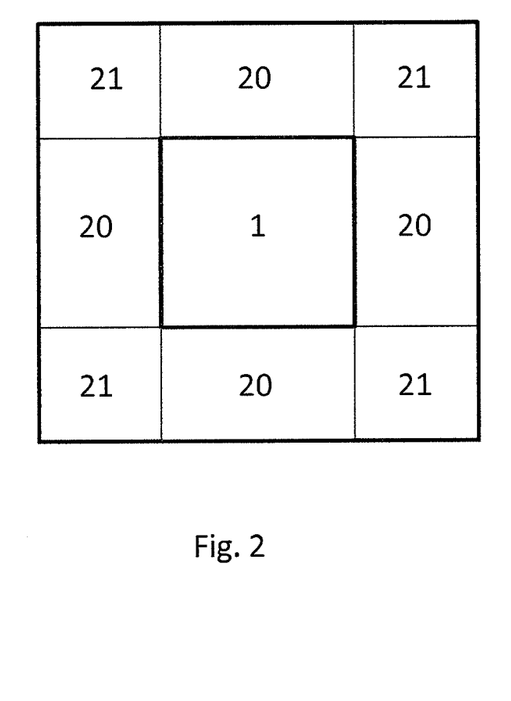

According to preferred embodiments, illustrated in FIG. 2, the magnetic field at locations lying in the extension area may be set to the same value as the nearest point in the predetermined area. For a rectangular predetermined area, this would mean that the boundary values of the predetermined area and thus measured area are set as a fixed, constant, value throughout the extension area along a direction which is orthogonal on the outer boundary of the predetermined area (portions 20). In the corner areas which are then remaining (21), the value of the corresponding corner of the predetermined area is set as a constant value. Subsequently, a window function is applied on the predetermined area and the extension area, which has a value "1" in the predetermined or measured area and which evolves continuously to a (near to) zero value on the outer boundary of the predetermined area. For instance, the window function can be a Tukey-window (illustrated in FIG. 5) or a Planck-Taper window. Alternatively a so-called "bump-function" or a "test-function" can be used, which have the property that they evolve from a value 1 to a value zero within a limited area, whereby they can be infinitely differentiated, and whereby they thus do not introduce discontinuities in the function or any of its first or higher order derivatives, which makes them suitable for being used as a window function in this context.

Figure 4:
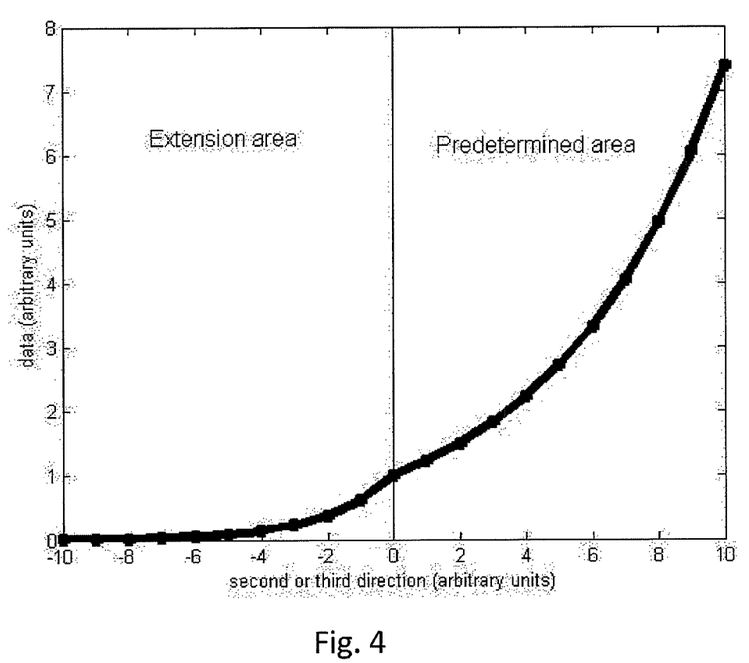
Figure 5:
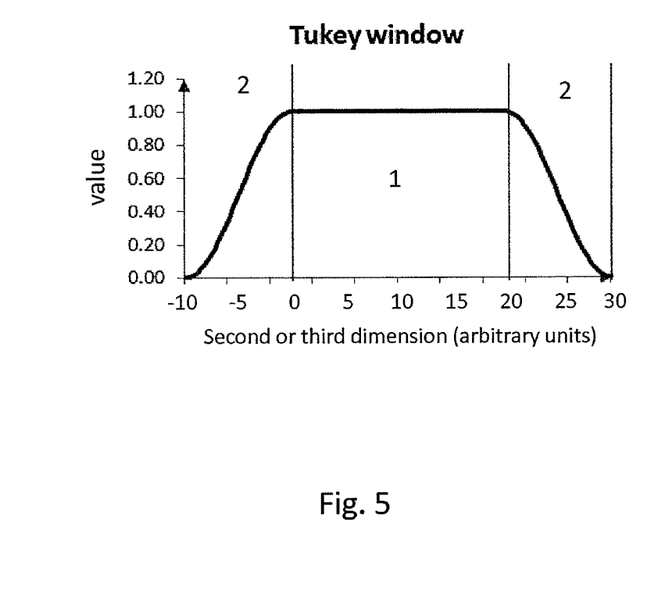

According to a further embodiment, illustrated in FIG. 4, the values of the first component of the magnetic vector field at the outer boundary of the predetermined area are evolving exponentially towards a zero value within the extension area. Preferably the exponential factor is predetermined such that its sufficiently small value or zero value is achieved on the outer boundary of the extension area. In practice, it is enough that the magnetic field distribution on the outer boundary of the extension area has a value which is below the measurement noise. This method guarantees the continuity of the values on the outer border of the predetermined area, but does not guarantee the continuity of the first derivative thereof.

In a further preferred embodiment, the first component of the magnetic vector field in the (boundary area of the) predetermined area is represented by a polynomial representation. The order of the extrapolated polynomial function can be reduced, for instance to order two ("quadratic polynomial"), or to order one ("linear polynomial"), in order not to obtain instable extrapolation values. This method guarantees that the continuity of the measurement values and of the derivatives is ascertained to the same extent as the order of the used polynomial function. In practice, it is further preferred to further apply a window-function on these extrapolated values, such that it can be guaranteed that the distribution of the first component of the magnetic field vector reaches a value which is small enough or zero at the outer boundary of the extension area.

In a further preferred embodiment, the first component of the magnetic vector field in the (boundary area of the) predetermined area is represented by a rational function representation. The order of the extrapolated rational function can be chosen, for instance to order −1 ("1/x"), order −2 ("$1/x^2$") or order −3 ("$1/x^3$"). The latter case is particularly useful since it corresponds to the decline rate of the magnetic field of a magnetic dipole, which is an approximation of a magnet at large distances from the magnet. This method guarantees that the magnetic field approaches zero when moving further into the extension area. In practice, it can further be preferred to apply a window-function on these extrapolated values, such that it can be guaranteed that the distribution of the first component of the magnetic field vector reaches a value which is small enough or zero at the outer boundary of the extension area.

Figure 6:
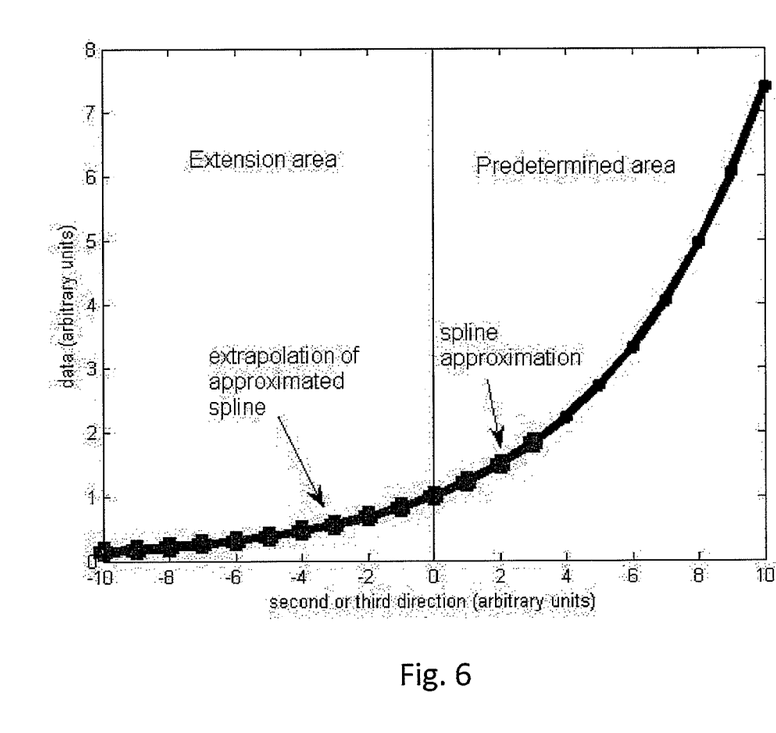
Figure 7:
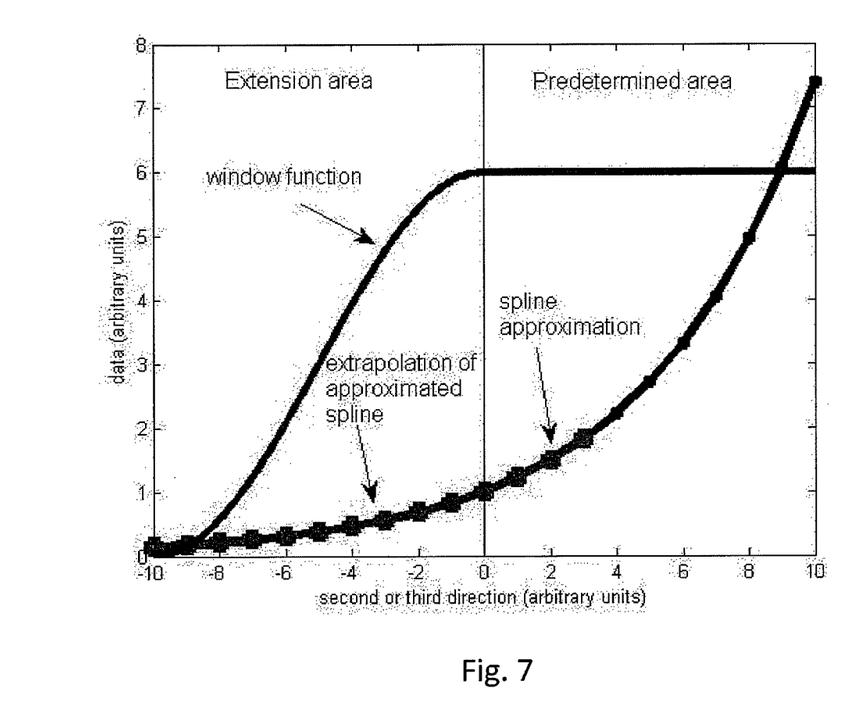

In a further preferred embodiment, the first component of the magnetic vector field in the (boundary area of the) predetermined area is represented by a "spline"-representation, illustrated in FIG. 6. The order of the extrapolated spline-function can be reduced, for instance to order two ("quadratic spline"), or to order one ("linear spline"), in order not to obtain instable extrapolation values. This method guarantees that the continuity of the measurement values and of the derivatives is ascertained to the same extent as the order of the used spline-function. In practice, it is further preferred to further apply a window-function on these extrapolated values, such that it can be guaranteed that the distribution of the first component of the magnetic field vector reaches a value which is small enough or zero at the outer boundary of the extension area. This is illustrated in FIG. 7.

According to a still further embodiment of the present invention, the values of the first component of the magnetic field at the boundary of the predetermined area can be extrapolated on the basis of a simulated magnetic field distribution for the magnetic object of which the magnetic field distribution was measured. Simulation algorithms can be used to calculate the magnetic field distribution based for instance on one or more properties of the magnetic object such as for instance shape, material, magnetization vector, position and so forth. Also here, use can be made of any of the methods disclosed for instance in EP2508906.

According to another embodiment of the present invention, the second and third components of the magnetic field distribution of a 'stitched' predetermined area are performed in the following way, where the 'overlap-add' or 'overlap-save' method is used. Thereby the Fourier transform, operations and inverse transform are performed on each individual predetermined area, which may or may not be zero padded, without applying the extrapolation methods described in the current invention. When combining the determined second and third components into the larger distribution, the overlap-save or overlap-add method is applied.

According to another embodiment of the present invention, the overlap-add or overlap-save method is used on a finite or an infinite extension area.

The invention claimed is:

1. A method for inspecting permanent magnets or magnet assemblies by determining a magnetic vector field in a predetermined area, said method comprising:
    placing a magnetic field camera in close vicinity of a permanent magnet or magnet assembly;
    determining distribution data comprising values of a first of three components of a magnetic vector field along a first direction, for a predetermined area defined on a predetermined surface by measuring measurement values of said first component by means of the magnetic field camera, said predetermined surface being defined by a second and a third direction, wherein said first, second and third directions constitute an orthogonal set of axes;
    determining distribution data comprising values of the second and the third component of said magnetic vector field in said second and said third direction respectively, for said predetermined area defined in said predetermined surface;
    wherein determining distribution data comprising values of the second and the third component is based on making use of intrinsic physical relations between the first, second and third components of said magnetic vector field.

2. The method according to claim 1, further comprising generating additional distribution data of said first component, said additional distribution data comprising expected values for said first component of said magnetic vector field in an extension area, said extension area adjacent to said predetermined area; and
    determining distribution data comprising values of the second and the third component of said magnetic vector field in said second and said third direction respectively, for an extended set of distribution data, said extended set of distribution data comprising said distribution data and said additional distribution data.

3. The method according to claim 1, wherein determining distribution data comprising values of the first component of the magnetic vector field along a first direction, for a predetermined area defined on a predetermined surface, further comprises modeling said measurement values of said first component based on a predetermined model and/or predetermined input parameters.

4. The method according to claim 2, wherein said distribution data of said first component comprises non-zero values for said first component of said magnetic vector field corresponding to a location at an outer border of said predetermined area.

5. The method according to claim 1, comprising determining said values of said first component comprised in said additional distribution data by simulation or modeling of said first component in said predetermined area and extrapolating the result of said simulation into said extension area.

6. The method according claim 2, wherein said values of said first component comprised in said additional distribution data are set to zero.

7. The method according claim 2, wherein said values of said first component comprised in said additional distribution data are set to be monotonously decreasing to zero in said extension area when moving from an outer boundary of said predetermined area, away from said predetermined area, towards an outer border of said extension area.

8. The method according to claim 7, comprising determining said values of said first component comprised in said additional distribution data by:
    extrapolating or setting values of said first distribution data of said first component corresponding to said outer boundary of said predetermined area onto said extension area;
    applying a window function on said extrapolated values for said extension area, said window function evolving from value 1 to value 0 over said extension area when moving away from said predetermined area.

9. The method according to claim 7, comprising determining said values of said first component comprised in said additional distribution data by generating values of the first component which are exponentially decreasing over said extension area when moving away from said predetermined area, starting from said outer boundary of said predetermined area, such that said values of said first component are attenuated towards zero at the outer boundary of said extension area.

10. The method according to claim 7, comprising determining said values of said first component comprised in said additional distribution data by
    generating a spline, polynomial or rational representation of said values of said first component of said magnetic vector field for at least part of said predetermined area;

extrapolating said spline, polynomial or rational representation to extrapolated values of said first component of said magnetic vector field in said extension area.

11. The method according to claim 10, further comprising applying a window function on said extrapolated values for said extension area, said window function evolving from value 1 to value 0 over said extension area when moving away from said predetermined area.

12. The method according to claim 1, where determining distribution data of said second and third components comprises performing a Fourier transformation, followed by performing calculations based on intrinsic physical relationships between the magnetic vector field components, followed by an inverse Fourier transformation.

13. The method according to claim 12, comprising performing said Fourier transformation, said calculations based on intrinsic physical relationships between the magnetic vector field components and said inverse Fourier transformation block-wise, thereby using 'overlap-add' or 'overlap-save' methods.

14. A device for inspecting permanent magnets or magnet assemblies by determining a magnetic vector field in a predetermined area, said device comprising:

a magnetic field camera for measuring measurement values of a first of three components for determining distribution data of the first of three components of the magnetic vector field along a first direction, for a predetermined area defined in a predetermined surface, said predetermined surface being defined by a second and a third direction, wherein said first, second and third direction constitute an orthogonal set of axes;

a means for determining distribution data of the values of second and the third component of said magnetic vector field in said second and said third direction respectively, for said predetermined area defined in said predetermined surface;

wherein said means for determining distribution data comprising values of the second and the third component is adapted for manipulating distribution data of the first component based on intrinsic physical relations between the first, second and third components of said magnetic vector field.

* * * * *